(12) United States Patent
Hirsch et al.

(10) Patent No.: US 10,489,160 B2
(45) Date of Patent: Nov. 26, 2019

(54) GENERAL PURPOSE DATA COMPRESSION USING SIMD ENGINE

(71) Applicant: Huawei Technologies Co., Ltd., Shenzhen (CN)

(72) Inventors: Michael Hirsch, Munich (DE); Yehonatan David, Munich (DE); Yair Toaff, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/246,179

(22) Filed: Jan. 11, 2019

(65) Prior Publication Data

US 2019/0146801 A1    May 16, 2019

Related U.S. Application Data

(63) Continuation of application No. PCT/EP2016/066798, filed on Jul. 14, 2016.

(51) Int. Cl.
*H03M 7/30* (2006.01)
*G06F 9/38* (2018.01)
(Continued)

(52) U.S. Cl.
CPC ........ *G06F 9/3887* (2013.01); *G06F 9/30036* (2013.01); *H03M 7/3084* (2013.01); *H03M 7/3086* (2013.01); *H03M 7/3088* (2013.01); *H03M 7/3091* (2013.01); *H03M 7/6023* (2013.01); *G06F 9/30178* (2013.01);
(Continued)

(58) Field of Classification Search
CPC ......... H03M 7/30; H03M 7/00; G10L 13/043; G06F 9/30178; G06F 21/125

USPC ............. 341/87, 50; 704/270, 747; 713/190, 713/189; 711/216

See application file for complete search history.

(56) References Cited

U.S. PATENT DOCUMENTS 8,766,827 B1    7/2014 Milne et al.
2017/0109056 A1*  4/2017 Gopal ................... G06F 3/0608

OTHER PUBLICATIONS

Salomon, "Statistical Methods, Data Compression:The Complete Reference," Third Edition, Springer, XKP002765054, pp. 134-155 (2004).

(Continued)

*Primary Examiner* — Joseph J Lauture
(74) *Attorney, Agent, or Firm* — Leydig, Voit & Mayer, Ltd.

(57) ABSTRACT

A system for compressing an input data stream to create a compressed output data stream is provided. The system comprises a memory storing a hash table comprising hash entries each comprising a hash value of an associated subset of following data items of an input data stream and a pointer to a memory location of the associated subset. A processor coupled to the memory executes operations while instructing an SIMD engine to execute concurrently one or more of the operations for consecutive subsets: calculate the hash value for each subset, search the hash table for a match of each calculated hash value and update the hash table according to the match result. The processor then updates the compressed output data stream according to the match result and a comparison result depending on the match result and operations for the plurality of associated subsets to create the compressed output data stream.

15 Claims, 6 Drawing Sheets

(51) Int. Cl.
*G06F 9/30* (2018.01)
*H03M 7/00* (2006.01)
*G10L 13/04* (2013.01)

(52) U.S. Cl.
CPC ............ *G10L 13/043* (2013.01); *H03M 7/00* (2013.01); *H03M 7/30* (2013.01)

(56) References Cited

OTHER PUBLICATIONS

Salomon, "Dictionary Methods, Data Compression:The Complete Reference," Third Edition, Springer, XP002765055, pp. 91-205 (2004).

Salomon, "Dictionary Methods, Data Compression:The Complete Reference," Third Edition, Springer, XP002765056, pp. 199-235 (2004).

Lomont, "Introduction to Intel® Advanced Vector Extensions," Internet Article, XP002765060, pp. 1-22 (Jun. 21, 2011).

Zhao et al, "A General SIMD-based Approach to Accelerating Compression Algorithms," Internet article XP002765061, pp. 1-8 (Feb. 2015).

Gopal et al, "High Performance DEFLATE Compression on Intel@ Architecture Processors," Internet article, XP002765062, pp. 1-16 (Nov. 2011).

Gueron et al, "Simultaneous hashing of multiple messages," Internet article, XP002765063, pp. 1-12 (2012).

Ziganshin et al, "Extremely fast hash," Internet article, XP002765084, pp. 1-30 (Jul. 2013).

Schlegel et al, "Fast Integer Compression using SIMD Instructions," Proceedings of the Sixth International Workshop on Data Management on New Hardware (DaMoN 2010), pp. 1-7 (Jun. 7, 2010).

Lemire et al, "SIMD Compression and the Intersection of Sorted Integers," arXiv:1401.6399v12 [cs.IR], pp. 1-29 (May 7, 2015).

* cited by examiner

GENERAL PURPOSE DATA COMPRESSION USING SIMD ENGINE

CROSS-REFERENCE TO RELATED APPLICATIONS

This application is a continuation of International Application No. PCT/EP2016/066798, filed on Jul. 14, 2016, the disclosure of which is hereby incorporated by reference in its entirety.

BACKGROUND

The present disclosure, in some embodiments thereof, relates to data compression and, more specifically, but not exclusively, to data compression using a single instruction multiple data (SIMD) engine.

Data compression is widely used for a plurality of applications to reduce the data volume for storage and/or transfer in order to reduce storage space for storing the data and/or network bandwidth for transferring the data.

Data compression involves encoding the data using fewer bits than the original representation of the data. While the data compression may significantly reduce the storage and/or networking resources, it may require additional processing and/or computation resources, for example, processing engines, memory resources and/or processing time. Many data compression methods, techniques and/or algorithms are currently available each employing a trade-off between the compression ratio and the required processing resources.

SUMMARY

According to a first aspect of the disclosure there is provided a system for compressing an input data stream to create a compressed output data stream, comprising a memory for storing a hash table, the hash table comprising a plurality of hash entries, each hash entry comprising a hash value of an associated one of a plurality of subsets of following data items of a plurality of data items of an input data stream and a pointer to a memory location of the associated subset; and a processor coupled to the memory adapted to:

execute the following operations while at least one of the operations is executed by instructing a single instruction multiple data, SIMD, engine to concurrently execute the at least one operation for each processed subset of a group of consecutive subsets of the plurality of subsets:

calculate the hash value for each one of the processed subsets, search the hash table for a match of each calculated hash value, and update the hash table according to the match result;

update the compressed output data stream according to the match result and a comparison result of a comparison that depends on the match result; and repeat the calculation, search and update for the plurality of associated subsets to create the compressed output data stream.

In a first possible implementation form of the first aspect of the disclosure as such each of the plurality of associated subsets includes a predefined number of data items defined according to the SIMD engine architecture.

In a second possible implementation form according to the first aspect as such or according to the first implementation form of the first aspect, the number of processed subsets in the group is set according to the SIMD engine architecture.

In a third possible implementation form according to the first aspect as such or according to the any of the preceding implementation forms of the first aspect, the match result indicates a match of the each calculated hash value with an existing hash value present in the hash table.

In a fourth possible implementation form according to the first aspect as such or according to the any of the preceding implementation forms of the first aspect, the comparison is conducted to produce the comparison result in case the match result indicates a match of the calculated hash value with a matching hash value in the hash table, and wherein the comparison comprises comparing between the data items of the processed subset with the calculated hash value and the data items of the associated subset pointed by the pointer in the matching hash entry.

In a fifth possible implementation form according to the first aspect as such or according to the any of the preceding implementation forms of the first aspect, in case the comparison result indicates the data items of the processed subset and the associated subset are identical, the processed subset is replaced with a pointer to the associated subset in the compressed output data stream, and in case the comparison result indicates the data items of the processed subset and the associated subset are not identical, the processed subset is updated in the compressed output data stream and the hash table is updated with a new hash entry for the processed subset.

In a sixth possible implementation form according to the first aspect as such or according to the any of the preceding implementation forms of the first aspect, the concurrent calculation comprises the processor loading the group of processed subsets to at least one SIMD register of the SIMD engine and the SIMD engine processing concurrently the group of subsets, the concurrent processing comprises:

spacing the processed subsets of the group from each other, shifting the processed subsets using a different shift value for each processed subset, and processing the processed subsets to create a hash value for each of the processed subsets.

In a seventh possible implementation form according to the first aspect as such or according to the any of the preceding implementation forms of the first aspect, the concurrent search for the match of each of the processed subsets in the hash table comprises the processor instructing the SIMD engine to search concurrently for a match of each of the calculated hash values with hash values stored in the hash table.

In an eighth possible implementation form according to the first aspect as such or according to the any of the preceding implementation forms of the first aspect, the concurrent update of the hash table with at least one processed subset comprises the processor instructing the SIMD engine to update concurrently the hash table with an entry associated with the at least one processed subset.

In a ninth possible implementation form according to the first aspect as such or according to the any of the preceding implementation forms of the first aspect, the compressed output data stream is compliant with a standard compressed output data stream compressed using legacy compression methods, the compressed output data stream is decompressed using legacy decompression methods.

According to a second aspect of the disclosure there is provided a method for compressing an input data stream to create a compressed output data stream, comprising:

storing a hash table comprising a plurality of hash entries, each hash entry comprising a hash value of an associated one of a plurality of subsets of data items of a plurality of data items of an input data stream and a pointer to a memory location of the associated subset;

executing the following operations while at least one of the operations is executed by instructing a single instruction multiple data, SIMD, engine of a processor to execute concurrently the at least one operation for each processed subset of a group of consecutive subsets of the plurality of associated subsets:

calculate the hash value for each one of the processed subsets, search the hash table for a match of each calculated hash value, and update the hash table according to the match result;

updating the compressed output data stream according to the match result and a comparison result of a comparison that depends on the match result; and repeating the calculation, search and update throughout the plurality of subsets to create the compressed output data stream.

In a first possible implementation form of the second aspect of the disclosure as such the concurrent calculation comprises the processor loading the group of processed subsets to at least one SIMD register of the SIMD engine, and the SIMD engine concurrently processing the group of processed subsets, the concurrent processing comprises:

spacing the processed subsets of the group from each other, and shifting the processed subsets using a different shift value for each processed subset, and processing the processed subsets to create a hash value for each of the processed subsets.

In a second possible implementation form according to the second aspect as such the concurrent search for the match of each of the processed subsets in the hash table comprises the processor instructing the SIMD engine to search concurrently for a match of each of the calculated hash values with hash values stored in the hash table.

In a third possible implementation form according to the second aspect as such the concurrent update of the hash table with at least one processed subset comprises the processor instructing the SIMD engine to update concurrently the hash table with an entry associated with the at least one processed subsets.

In a fourth possible implementation form according to the second aspect as such or according to the any of the preceding implementation forms of the first aspect, the compressed output data stream is compliant with a standard compressed output data stream compressed using legacy compression methods, the compressed output data stream is decompressed using legacy decompression methods.

Unless otherwise defined, all technical and/or scientific terms used herein have the same meaning as commonly understood by one of ordinary skill in the art to which the disclosure pertains. Although methods and materials similar or equivalent to those described herein can be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings.

DETAILED DESCRIPTION

Figure 1:
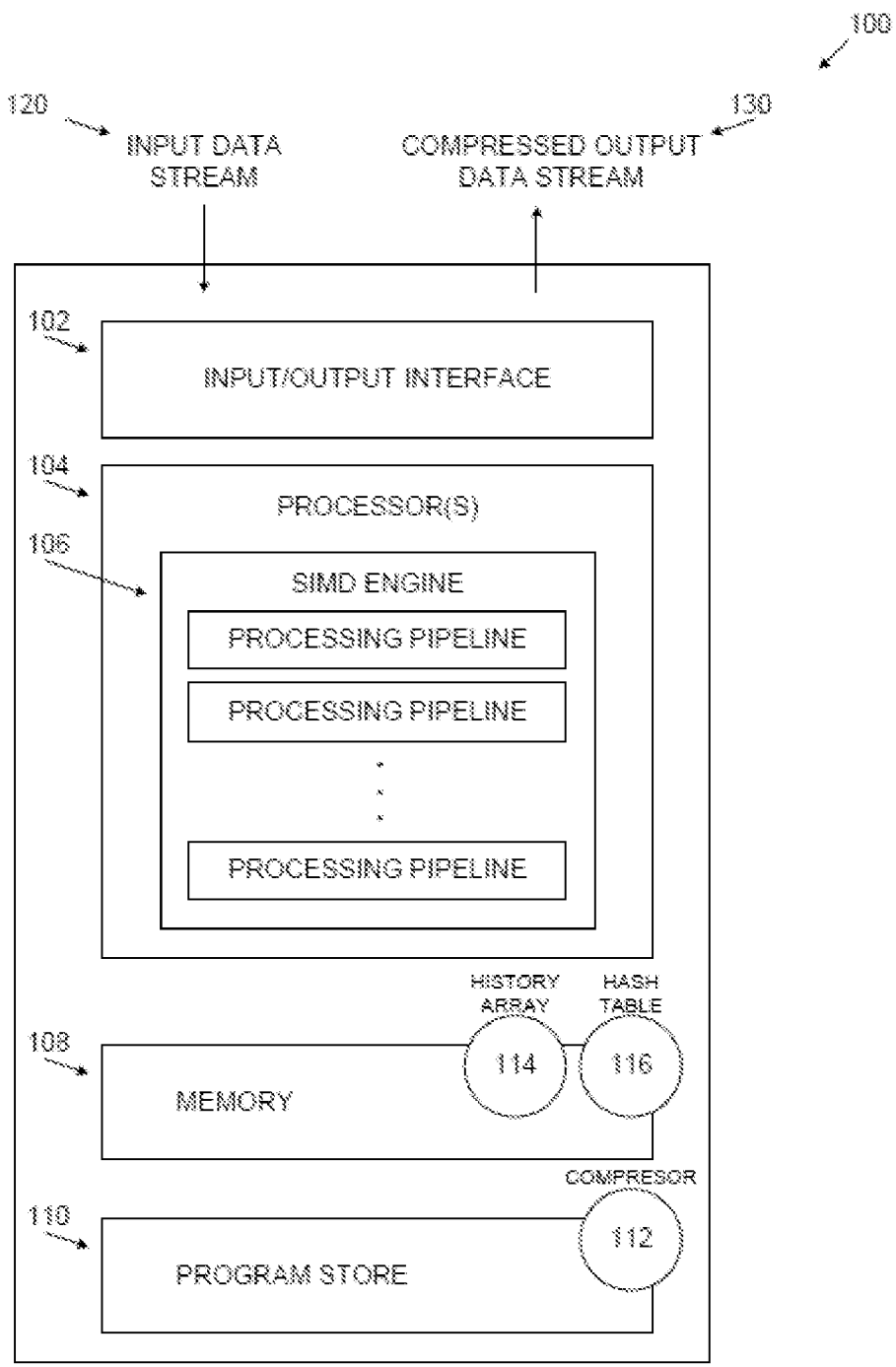
FIG. 1 is a schematic illustration of an exemplary system for compressing an input data stream using a SIMD engine, according to some embodiments of the present disclosure.

The present disclosure, in some embodiments thereof, relates to data compression and, more specifically, but not exclusively, to data compression using a SIMD engine.

The present disclosure presents systems and methods for general-purpose data compression using a SIMD engine of one or more processors for a plurality of applications requiring the data compression in order to reduce the amount (volume) of data, for example, data storage and/or data transfer. An input data stream comprising a plurality of data items, for example, bytes, words, double-words and/or pixels is compressed by replacing repetitive data sequences with pointers to previous instances of the repetitive data sequences. The compression systems and methods presented herein utilize lossless compression methods and/or algorithms as known in the art, for example, Lempel-Ziv (LZ77 and LZ78), Lempel-Ziv-Welch (LZW), Lempel-Ziv-Oberhumer (LZO) and/or LZ4. The compression methods are explained in the present disclosure only to the extent required to demonstrate the compression operations executed by the SIMD engine of the processor(s) to enhance the compression process, for example reduce compression resources and/or compression time. It is however expected of a person skilled in the art to be familiar with all aspects of the compression methods. The compression scheme utilizes the SIMD engine for concurrent execution of one or more operations during the compression process, processing subsets of consecutive data items to calculate respective hash values, searching for a match of the hash values in a hash table and/or updating the hash table with hash values and pointers to the associated subsets. The SIMD engine supports execution of a single instruction (processor instruction) over multiple data items concurrently. The compression methods and/or algorithms may be somewhat manipulated to support the concurrent execution by the SIMD engine.

Applying the SIMD engine technology to the data compression process may present significant advantages compared to currently existing sequential compression methods (legacy and/or standard compression methods). Vector processing technology in general and SIMD technology in particular is rapidly advancing in many aspects, for example, a number of data items that may be processed in parallel and/or processing power of the processor(s). The sequential data compression employed by the currently existing compression methods may be a major time consuming and/or processor intensive operation. Since the data items of the input data stream may be regarded as independent from each other with respect to the fundamental operation of the compression process, simultaneous processing of the input data stream may take full advantage of the SIMD engine and/or technology. The compression time and/or computation resources may be significantly reduced using the SIMD engine. Executing even one of the compression operations concurrently may significantly increase the compression performance, therefore applying the SIMD engine to execute two or all the compression operations, for example, processing the subsets to calculate the hash values, searching for a match of the hash values and/or updating the hash table, may present an even more significant compression performance improvement.

The format of the compressed data (stream) compressed using the SIMD engine may be fully compliant with compressed data using some legacy compression methods. The full compliance of the compressed data using the SIMD engine allows decompression of the compressed data using standard decompression methods, techniques and/or tools as known in the art for decompressing the compressed data. Of course, the decompression methods, techniques and/or tools may need to be selected appropriately according to the used compression format. For example, LZ4 decompression may be employed to decompress compressed data compressed utilizing the SIMD engine according to LZ4 compressed data format.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network and/or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference is now made to FIG. 1, which is a schematic illustration of an exemplary system for compressing an input data stream using a SIMD engine, according to some embodiments of the present disclosure. A system 100 includes an input/output (I/O) interface 102 for receiving and/or designating an input data stream 120 and outputting a compressed output data stream 130, a processor(s) 104 comprising a SIMD engine 106 for compressing the input data stream 120 to create the compressed data stream 130, a memory 108 and a program store 110. The input data stream 120 may be received in one or more formats, for example, a data file, a media file, a streaming data and the like. The input data stream 120 includes a plurality of data items, for example, bytes, words, double-words and/or pixels which may be arranged in sequence as a stream. The I/O interface 102 may include one or more interfaces, for example, a network interface, a memory interface and/or a storage interface. The I/O interface 102 may be used by the processor(s) 104 to receive and/or transmit the data streams 120 and/or 130 over a network and/or one or more local peripheral interfaces, for example, a universal serial bus (USB), a secure digital (SD) card interface and/or the like. The I/O interface 102 may also be used by the processor(s) 104 to fetch and/or store the data streams 120 and/or 130 to a memory such as the memory 108 device and/or a storage device such as the program store 110. The processor(s) 104, homogenous or heterogeneous, may be arranged for parallel processing, as clusters and/or as one or more multi core processor(s) each having one or more SIMD engines 106. The SIMD engine 106 comprises a plurality of processing pipelines for vector processing, for example processing multiple data items concurrently. The program store 110 may include one or more non-transitory persistent memory storage devices, for example, a hard drive, a Flash array and/or the like. The program store 110 may further comprise one or more network storage devices, for example, a storage server, a network accessible storage (NAS) a network drive and/or the like.

Figure 2:
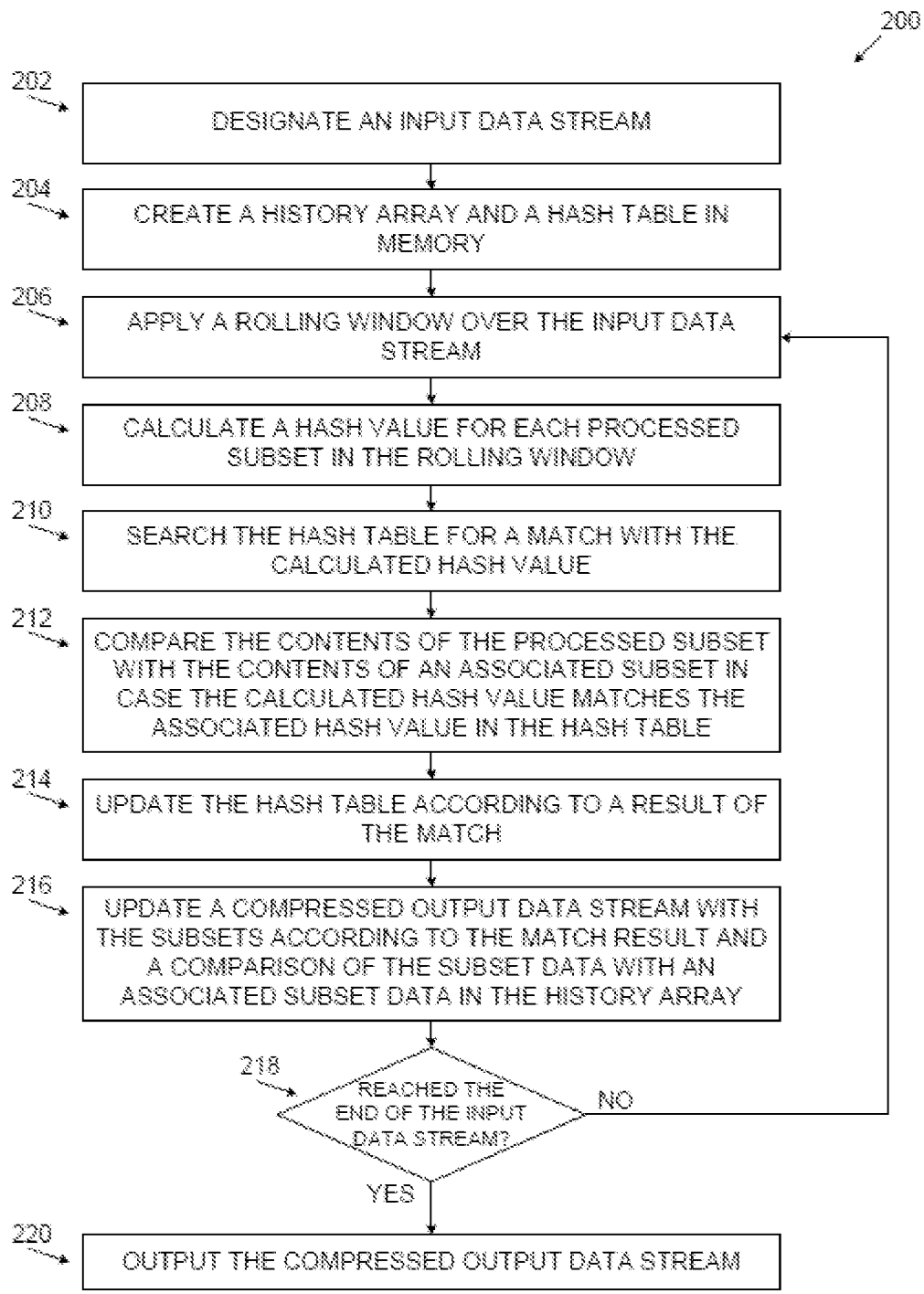
FIG. 2 is a flowchart of an exemplary process for compressing an input data stream using a SIMD engine, according to some embodiments of the present disclosure.

Reference is also made to FIG. 2, which is a flowchart of an exemplary process for compressing an input data stream using a SIMD engine, according to some embodiments of the present disclosure. A compression process 200 for compressing the input data stream may be performed by a system such as the system 100. The compression process 200 employs the SIMD engine 106 to process concurrently multiple data items of the input data stream 120 to produce the compressed output data stream 130.

The compression process 200 may be done by one or more software modules such as, for example, a compressor 112 that comprises a plurality of program instructions executed by the processor(s) 104 and/or the SIMD engine 106 from the program store 110. The compressor 112 may be executed by a processing unit of the processor(s) 104 to manage and/or coordinate the compression process, for example, load data to the SIMD engine 106, collect data from the SIMD engine 106, synchronize data, synchronize tasks, update the compressed output data stream 130 and/or the like. The processor(s) 104 executing the compressor 112 may instruct the SIMD engine 106 to process concurrently multiple data items of the input data stream 120 and/or interim products during the compression process 200 in order to expedite the compression process 200 thus reducing processing resources and/or processing time. The concurrent processing is applied by the processor(s) 104 initiating a single instruction to the SIMD engine that executes concurrently the operation (instruction) over multiple data items and/or interim products using the plurality of processing pipelines. The compressor 112 may create a one or more data structures in the memory 108 to control the compression sequences 200, for example, a history array 114, a hash table 116 and/or the like.

As shown at 202, the process 200 starts with the compressor 112 receiving the input data stream 120 using the I/O interface 102, for example, receiving the input data stream 120 from a remote device over the network(s), fetching the input data stream 120 from the local peripheral interface(s), from the memory 108 and/or the program store 110.

The system 100 executing the compression process 200 compresses the input data stream 120 using one or more lossless compression methods, for example as known in the art, for instance Lempel-Ziv (LZ77 and LZ78), Lempel-Ziv-Welch (LZW), Lempel-Ziv-Oberhumer (LZO) and/or LZ4. As mentioned before the compression methods are explained in the present disclosure only to the extent required to demonstrate the compression operations executed by the SIMD engine 106 to enhance the compression process 200.

Before further presenting the embodiments for compressing the input data stream 120 utilizing the SIMD engine 106, some basic aspects of the compression methods are first described. The basic concept of the compression methods is to identify duplicate sequences of data in the input data stream 120 and replace the duplicated sequences with pointers to a previous instance of the same sequence instead of placing the duplicated sequence itself in the compressed output data stream 130. A sliding window is applied to the input data stream 120 to designate rolling sequences comprising consecutive data items of the input data stream 120. The data items of the rolling sequences are stored in a history array such as the history table 114. A hash value is calculated for each of the rolling sequences and stored in a hash table entry of a hash table such as the hash table 116. Each of the hash table entries comprises pairs of the calculated hash value and a pointer to an associated sequence in the history array 114. For every new rolling sequence, the hash value is calculated and searched for a match in the hash table 116 to check if an identical hash value exists in the hash table 116. In case a match is found, the new rolling sequence may be identical to a previous rolling sequence associated with the matching hash value.

A plurality of hash functions may be used to calculate the hash value. Selection of the hash functions may present a trade-off between computation complexity and/or processing time and certainty of similarity of the two subsets. It is possible to calculate a complex hash value that will be unambiguous such that each of the rolling sequences is associated with a unique hash value. However the complex hash value calculation may be very computation demanding. Lower complexity hash functions may produce less complex hash values for the rolling sequences, however, some level of ambiguity may exist, for example, the calculated hash value may be the same for two or more not similar rolling sequences. In such cases of lower complexity hash values, the actual data items of the new rolling sequence and the previous rolling sequence having the same hash value need to be compared to determine the match. In case the match is detected, indicating the new rolling sequence is identical to the matching previous rolling sequence, the new rolling sequence may not be included in the compressed output data stream 130 but rather be replaced with a pointer to the location of the matching previous rolling sequence. The pointer may be placed at the appropriate position in the compressed output data stream 130 where the replaced rolling sequence needs to be inserted. In case no match was detected, the rolling sequence is included in the compressed output data stream 130. Following the hash table search, the hash table may be updated accordingly. In case a match is not found, the hash table may be updated to include the new hash value calculated for the new rolling sequence. In case all the hash entries are occupied, one or more hash values associated with the previous rolling sequences may be omitted from the hash table, for example, the least frequently matching hash entry and/or the like.

The size of the history array 114, for example the number of the previous rolling sequence available for comparison, may vary. In the case of a large history array 114, for example, comprising more previous rolling sequence available for comparison, the probability for the match is increased, and hence leading to improved compression. However the larger the history array 114, the more search operations and/or memory resources are required thus increasing the processing resources and/or processing time for compression. For most of the compression methods, the size of the history array 116 is typically 2 KB, 4 KB, 8 KB, 16 KB and/or 32 KB to achieve best trade-off between the compression efficiency and the consumed processing and/or memory resources.

Typically, the compression methods employ a serial sequence to calculate the hash value for each of the rolling sequence, search the hash table and update the hash table accordingly. The compression process 200 on the other hand may perform one or more of the calculation, search and/or update operations concurrently using the SIMD engine 106 to expedite the compression process 200.

As shown at 204, the compressor 112 creates the history array 114 in the memory 108 to store the most recent subsets. The typical size of the history array 114 is 2 KB, 4 KB, 8 KB, 16 KB and/or 32 KB. Other sizes may be assigned to the history array 114 according to availability of processing resources and/or a size of the memory 108. The compressor 112 also creates the hash table 116 in the memory 108 to store hash entries comprising a pointer to one of the subsets stored in the history array 114 and a hash value calculated for the associated subset. Naturally, initially, at the beginning of the compression process 200, the history array 114 and the hash table 116 are empty and are gradually filled with the subsets (rolling sequences) as the sliding window is applied to the input data stream 120.

As shown at 206, the compressor 112 applies the rolling window over the input data stream 120. The size of the window that dictates the size of each of the subsets may be adapted according to the architecture of the processor 104 and/or the architecture of the SIMD engine 106. The compressor 112 sides the sliding window over the input data stream 120 such that during every slide of the window (shift), the earliest (first) data item of a previous rolling sequence is omitted and a new data item is added to create a new rolling sequence.

As shown at 208, the compressor 112 calculates the hash values for the new rolling sequence using the SIMD engine 106. In order to allow concurrent processing of the rolling sequence, the rolling sequence is split to a plurality of processed subsets each comprising consecutive data items of the rolling sequence. The group (rolling sequence) of processed subsets is processed concurrently using the SIMD engine 106. The number of the processed subsets in the group may be adapted according to the architecture of the processor 104 and/or the architecture of the SIMD engine 106. The compressor 112 loads the processed subsets to one or more registers of the SIMD engine 106 to calculate the hash value for each of the subsets. The type, synopsis, characteristics and/or usage of the load instructions issued by the compressor 112 to SIMD engine may be adapted according to the architecture of the processor(s) 104 and/or the SIMD engine 106.

Figure 3A:
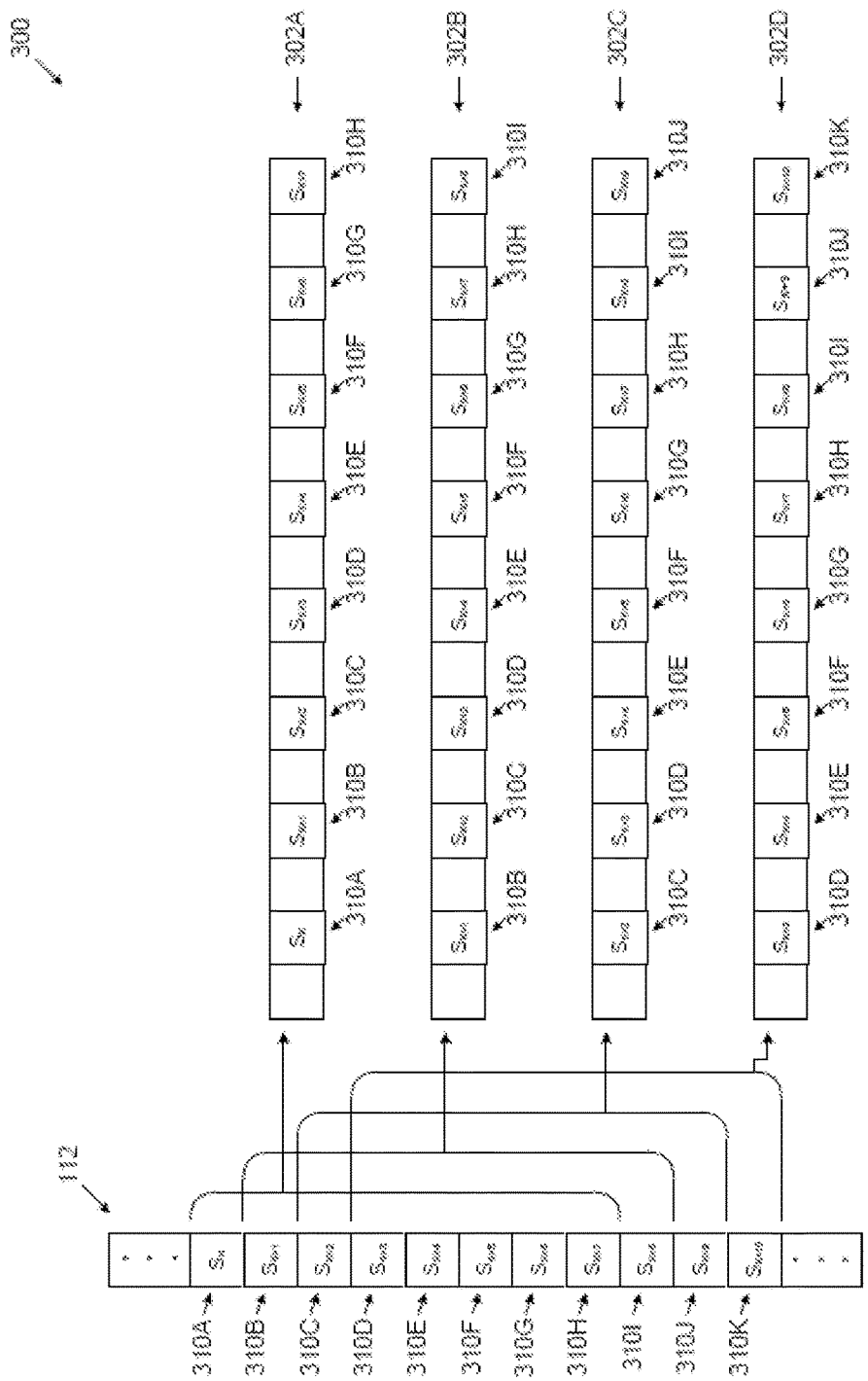
FIG. 3A is a schematic illustration of an exemplary sequence for loading simultaneously a plurality of consecutive bytes of an input data stream into registers of a SIMD engine, according to some embodiments of the present disclosure.
Figure 3B:
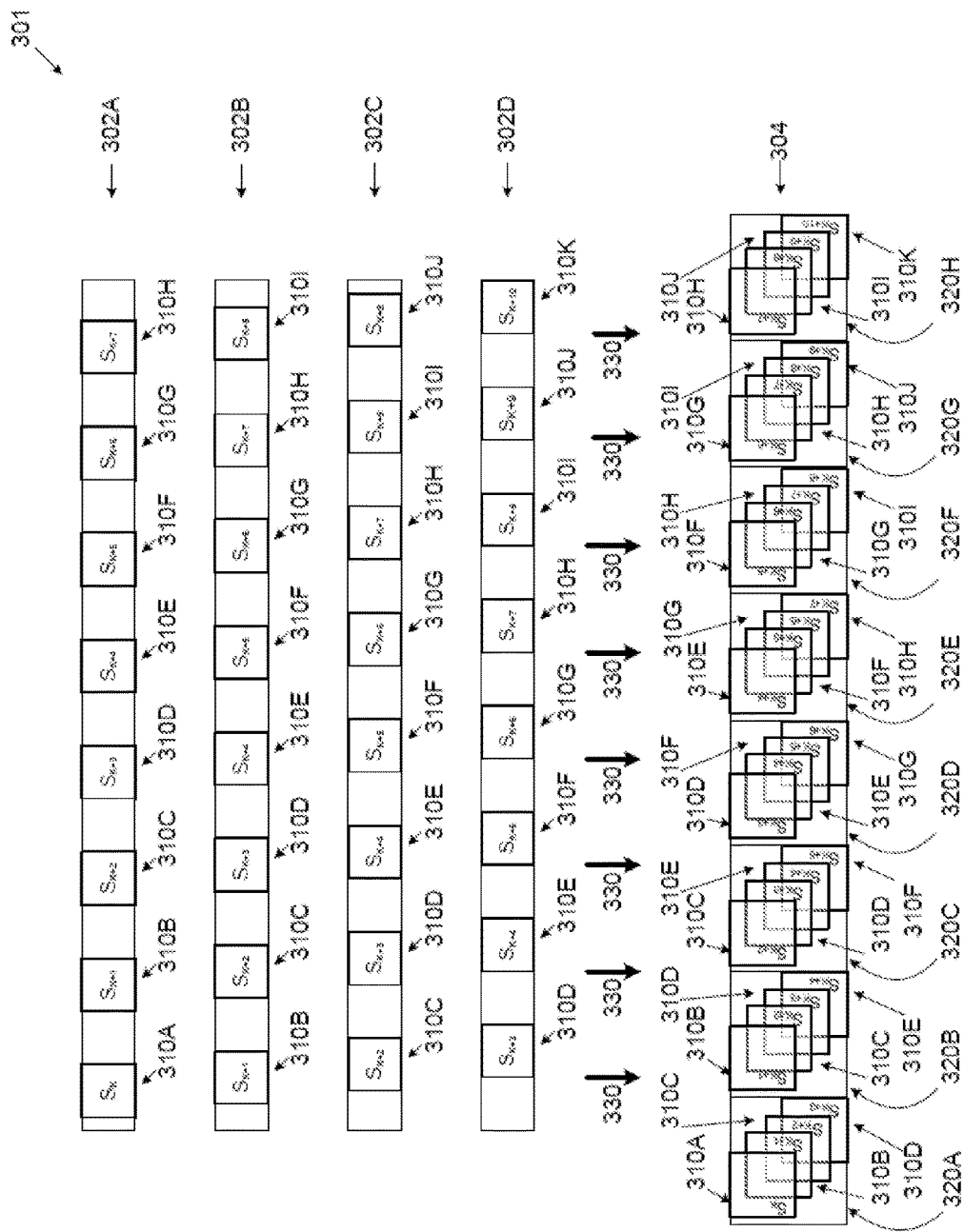
FIG. 3B is a schematic illustration of an exemplary sequence for calculating simultaneously a hash value for a plurality of subsets each comprising consecutive bytes of an input data stream using a SIMD engine, according to some embodiments of the present disclosure.

Reference is now made to FIG. 3A, which is a schematic illustration of an exemplary sequence for loading simultaneously a plurality of consecutive bytes of an input data stream into registers of a SIMD engine, according to some embodiments of the present disclosure. Reference is also made to FIG. 3B, which is a schematic illustration of an exemplary sequence for calculating simultaneously a hash value for a group of subsets each comprising consecutive bytes of an input data stream using a SIMD engine, according to some embodiments of the present disclosure. During an exemplary load sequence 300, a compressor such as the compressor 112 loads consecutive data items 310 to four registers 302A through 302D of the SIMD engine 106, in such a way that each successive register will contain a window of the data slid by one item. The number of consecutive data items loaded to registers 302 dictates the size of each of the processed subsets and/or the size of the group of subsets. The exemplary sequence presented in FIG. 3A describes an SIMD engine utilizing a 16 byte architecture, for example each register is 16 bytes wide allowing concurrent processing of a group of 8 subsets, for example calculating 8 hash values 320 each calculated for a subset comprising 4 consecutive data items 310. As will be described later the data items 310 need to be spaced apart to allow the SIMD engine 106 to calculate concurrently the 8 hash values 320. The data items 310 are spaced apart such that each byte (8-bits) occupies a word (16-bits) space, thus the 32 data items 310 occupy the four registers of 16 bytes to fit the register width of the exemplary SIMD engine 106. Other architectures of the SIMD engine 106, for example, 32, 64, 128 256 bytes and/or the like may allow loading a different numbers of consecutive data items 310 to the register 302 of the SIMD engine 106. Since the hash values 320 are calculated for every 4 consecutive data items 310, the 32 bytes loaded to the SIMD engine 106 are composed of 11 consecutive data items $S_K$ 310A through $S_{K+10}$ 310K.

Assuming the processor 104 is, for example, an Intel Architecture (IA) processor employing a Streaming SIMD Extensions (SSE) instruction set for operating the 16 bytes SIMD engine 106, the load operation of the 32 bytes may require 8 instructions.

During the loading operation, the compressor 112 converts the data items bytes (8-bits) to words (16-bit) such that each data item occupies a word space as shown in FIG. 3B.

The compressor 112 instructs the SIMD engine 106 to shift the data items 310 loaded in the register 302. A different shift is applied to each of the register portions 302A-302D such that:

The data items $S_K$ 310A through $S_{K+7}$ 310H stored in the register portion 302A are shifted 6 bits to the left.

The data items $S_{K+1}$ 310B through $S_{K+8}$ 310I stored in the register portion 302B are shifted 4 bits to the left.

The data items $S_{K+2}$ 310C through $S_{K+9}$ 310J stored in the register portion 302B are shifted 2 bits to the left.

The data items $S_{K+3}$ 310D through $S_{K+10}$ 310K stored in the register portion 302D are not shifted at all.

The degree of shifting applied to the register 302 depends on the number of consecutive data items 310 loaded into the register 302 hence the degree of shifting depends on the architecture of the SIMD engine 106.

During an exemplary processing sequence 301 following the load sequence 300, the compressor 112 may instruct the SIMD engine 106 to calculate 330 concurrently the hash value 320 for each of the processed subsets. The type, synopsis, characteristics and/or usage of the calculation instructions issued by the compressor 112 to SIMD engine may be adapted according to the architecture of the processor(s) 104 and/or the SIMD engine 106. The calculation 330 of the hash values 320 may be a simple XOR operation performed over subsets of consecutive data items 310. The subsets of the consecutive data items 310 are referred to as the processed subsets. Each of the processed subsets comprises 4 data consecutive items 310, for example, a first processed subset includes the data items $S_K$ 310A through $S_{K+3}$ 310D, a second processed subset includes the data items SK+1 310B through SK+4 310E and so on to a last processed subset that includes the data items SK+7 310I through SK+10 310K.

The SIMD engine 106 calculates concurrently the hash values 320 for all the processed subsets by applying the calculation 330 that may be a simple XOR operation over the respective 4 data items 310 included in each of the processed subset. For the presented exemplary sequence and architecture of the SIMD engine 106, the SIMD engine 106 produces 8 hash values 320, a hash value 320A for the data items SK 310A through SK+3 310D, a hash value 320B for the data items SK+1 310B through SK+4 310E, a hash value 320C for the data items SK+2 310C through SK+5 310F, a hash value 320D for the data items SK+3 310D through SK+6 310G, a hash value 320E for the data items SK+4 310E through SK+7 310H, a hash value 320F for the data items SK+5 310F through SK+8 310I, a hash value 320G for the data items SK+6 310G through SK+9 310J and a hash value 320H for the data items SK+7 310H through SK+10 310K. The calculated hash values 320 are stored in a register 304 of the SIMD engine 106.

Assuming the processor 104 is, for example, an IA processor employing the SSE instruction set for operating the 16 bytes SIMD engine 106, the calculation of the 32 hash values 320 may require 6 instructions.

Reference is made once again to FIG. 2. As shown at 210, the compressor 112 searches for a match of each of the calculated hash values 320 by comparing each of the calculated hash values 320 with each of a plurality of hash values available in hash entries of the hash table 116. A match is found for one of the calculated hash values 320 in case an identical hash value is found in one of the hash entries of the hash table 116. The compressor 112 may issue instruction(s) to instruct the SIMD engine 106 to search concurrently for a match of each of the calculated hash values 320 in the hash table 116. The type, synopsis, characteristics and/or usage of the search instructions issued by the compressor 112 to SIMD engine may be adapted according to the architecture of the processor(s) 104 and/or the SIMD engine 106. For example, for an IA processor 104, the compressor 112 may use the "gather" instruction from the SSE instruction set as presented in function 1 below to instruct the SIMD engine 106 to execute the search operation.

The compressor 112 may issue the "gather" instruction as expressed in pseudo code excerpt 1 below to instruct the SIMD engine 106 to execute the search operation.

Pseudo Code Excerpt 1:
  Result[i]=hashTable[hashes[i]] for i in 0 . . . 15

As shown at 212, in case one or more of the calculated hash values 320 matches one of the stored hash values in the hash table 116, the compressor 112 may initiate further comparison to determine whether the processed subset is identical to the associated subset pointed by the hash entry that includes the matching stored hash value. The further comparison may be required since the hash function calculation 330 used by the compressor 112 may be a simple XOR operation that may present ambiguous results, for example an identical hash value 320 may be calculated for different subsets with different data items 310. The further comparison includes comparing the data items 310 included in the processed subset and the data items 310 included in the associated subset associated with the matching stored hash value in the hash table 116. In case the data items 310 of both the processed subset and the associated subset are similar, the compressor 112 issues a match indication for the processed subset.

Figure 4:
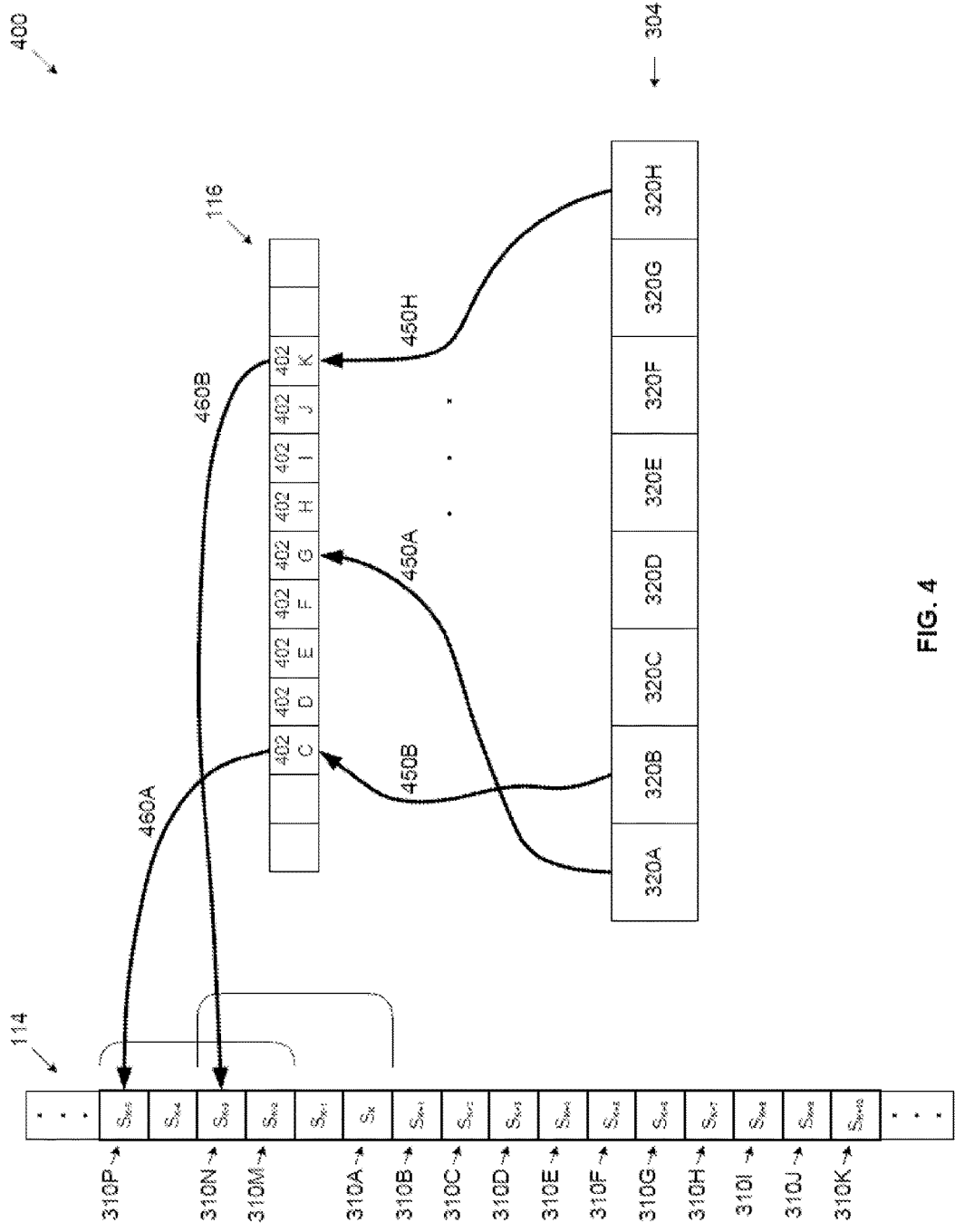
FIG. 4 is a schematic illustration of an exemplary sequence for searching simultaneously for a match of a plurality of hash values in a hash table using a SIMD engine, according to some embodiment of the present disclosure.

Reference is now made to FIG. 4, which is a schematic illustration of an exemplary sequence for searching simultaneously for a match of a plurality of hash values in a hash table using a SIMD engine, according to some embodiment of the present disclosure. During an exemplary search sequence 400, a compressor such as the compressor 112 instructs a SIMD engine such as the SIMD engine 106 to search concurrently for a match of a plurality of calculated hash values such as the hash values 320 with hash values stored in hash entries 402 in a hash table such as the hash table 116. The exemplary sequence 400 follows the previous examples of the exemplary load sequence 300 and the exemplary concurrent calculation sequence 301. The SIMD engine 106 initiates 8 comparison operations 450 concurrently to compare each of the calculated hash values 320 stored in the register 304 to each of the stored hash values available in hash entries 402 in the hash table 116. Each search operation is associated with one of the calculated hash values 320, for example, a search operation 450A is associated with the calculated hash value 320A, a search operation 450B is associated with the calculated hash value 320B and so on up to a search operation 450H is associated with the calculated hash value 320H. As seen in the exemplary search sequence 400, during the search operation 450A, no match is found between the respective calculated hash values 320A. However, an empty hash entry 402G is detected in the hash table 116. During the search operation Function 1:

```
    void __m512i _m512_132gather_epi32 (__m512i vindex, void const* base_addr, int scale)
  Synopsis:
    void __m512i _m512_132gather_epi32 (__m512i vindex, void const* base_addr, int scale)
    #include "immintrin.h"
    Instruction : vpgatherdd zmm32z {k}, vm32z
    CPUID Flags : AVX512F for AVX-512, KNCNI for KNC
  Description:
    Gather 32-bit integers from memory using 32-bit indices. 32-bit elements are loaded from
address starting at base_addr and offset by each 32-bit element in vindex (each index is scaled
by the factor in scale). scale should be 1, 2, 4 or 8.
    Operation:
      FOR j := 0 to 15
        i := j*32
        dst[i+31:i] := MEM[base_addr + SignExtend(vindex[i+31:i])*scale]
      ENDFOR
      Dst[MAX:512] := 0
```

450B, a match is found between the respective calculated hash value 320B and a stored hash value in a hash entry 402C. Another match is detected during the search operation 450H between the respective calculated hash value 320H and a stored hash value in a hash entry 402K. Since the hash function calculation 330 used by the SIMD engine 106 may be a simple XOR operation over the data items 310, the hash value 320 may be ambiguous. Therefore, the actual data items 310 of the processed subset and the subset associated with the matching stored hash value in the hash table 116 need to be compared to determine a definite match. The compressor 112 may initiate a comparison operation 460 for each matching calculated hash value 320 in the history array 114. For example, the SIMD engine 106 indicated a match between the calculated hash value 320B and a hash value stored in the hash entry 402C. The compressor therefore initiates a comparison operation 460A to compare the data items 310 of the dataset associated with the hash entry 402C. For example, assuming the hash entry 402C is associated with a subset starting at data item SK−5 310P, the compressor 112 compares data items SK+1 310B through SK+4 310E (producing the hash value 320B) with respective data items SK−5 310P through SK−2 310M to determine a match. In case the data items SK+1 310B through SK+4 310E are similar to the data items SK−5 310P through SK−2 310M, the compressor 112 may indicate a match. Similarly, the compressor 112 initiates a comparison operation 460B to compare the data items 310 of the dataset associated with the hash entry 402K. For example, assuming the hash entry 402K is associated with a subset starting at data item SK−3 310N, the compressor 112 compares data items SK+7 310H through SK+10 310K (producing the hash value 320H) with respective data items SK−3 310N through SK 310A to determine a match. In case the data items SK+7 310H through SK+10 310K are similar to the data items SK−3 310N through SK 310A, the compressor 112 may indicate a match.

Reference is made once again to FIG. 2. As shown at 214, the compressor 112 updates the hash table 116 according to the match results. The compressor 112 may issue scenarios using one or more update schemes. In one scheme, all the processed subsets are associated with entries in the hash table 116. However, in case, for example, the hash table 116 includes more hash entries 402 than the number of concurrently processed subsets, the compressor 112 may apply one or more schemes for updating the hash table 116. For example, in case one or more empty hash entries such as the hash entries 402 are detected during the match search operation of the SIMD engine 106, one or more of the hash entries 402 with each of the empty hash entries may be updated to be associated with one of the processed subsets. This means that the respective hash entry 402 is created to include a calculated hash value such as the calculated hash value 320 of the respective processed subset and a pointer to the first data item such as the data item 310 of the processed subset.

In another scenario, during the match search operation of the SIMD engine 106 one or more calculated hash values 320 match one or more hash values stored in the hash table 116. However, following the comparison operation the compressor 112 indicates the contents (data items) of the processed subset(s) and the contents (data items) of the associated subset (pointed by the matching hash entry) are not the same. In such case the compressor 112 may update the respective hash entry 402 in the hash table 116 with a pointer pointing to the first data item 310 of the processed subset. The hash value is naturally the same and therefore the compressor 112 does not alter it.

The compressor 112 may further apply one or more methods and/or techniques for dropping one or more of the hash entries 402 to allow newly created hash entries 402 comprising new calculated hash values 320 associated with recent subsets.

The type, synopsis, characteristics and/or usage of the update instruction(s) issued by the compressor 112 to SIMD engine may be adapted according to the architecture of the processor(s) 104 and/or the SIMD engine 106. For example, for the IA processor 104, the compressor 112 may use the "scatter" instruction from the SSE instruction set as presented in function 2 below to instruct the SIMD engine 106 to execute the update operation in the hash table 116.

---
Function 2:

void ___m512i _m512_132scatter_epi32 (void* base_addr, ___m512i vindex, ___512i a, int scale)
    Synopsis:
        void ___m512i _m512_132scatter_epi32 (void* base_addr, ___m512i vindex, ___512i a, int scale)
        #include "immintrin.h"
        Instruction : vpscatterdd vm32 {k}, zmm
        CPUID Flags : AVX512F for AVX-512, KNCNI for KNC
    Description:
        Scatter 32-bit integers from a into memory using 32-bit indices. 32-bit elements are stored at addresses starting at base_addr and offset by each 32-bit element in vindex (each index is scaled by the factor in scale). scale should be 1, 2, 4 or 8.
        Operation:
            FOR j := 0 to 15
                i := j*32
                MEM[base_addr + SignExtend(vindex[i+31:i])*scale] := a[i+31:i]
            ENDFOR

--- instruction(s) to instruct the SIMD engine 106 to update concurrently one or more of the hash entries 402 with new hash entries 402 associated with respective one or more processed subsets. I.e., each of the new hash entries 402 comprises the calculated hash value 320 for the respective subset and a pointer to the respective subset in the history array 114. The hash table 116 may be updated in one or more The compressor 112 may issue the scatter instruction as expressed in pseudo code excerpt 2 below to instruct the SIMD engine 106 to execute the update operation.
Pseudo Code Excerpt 2:
    hash Table[hashes[i]]=position[i] for i in 0 . . . 15

Figure 5:
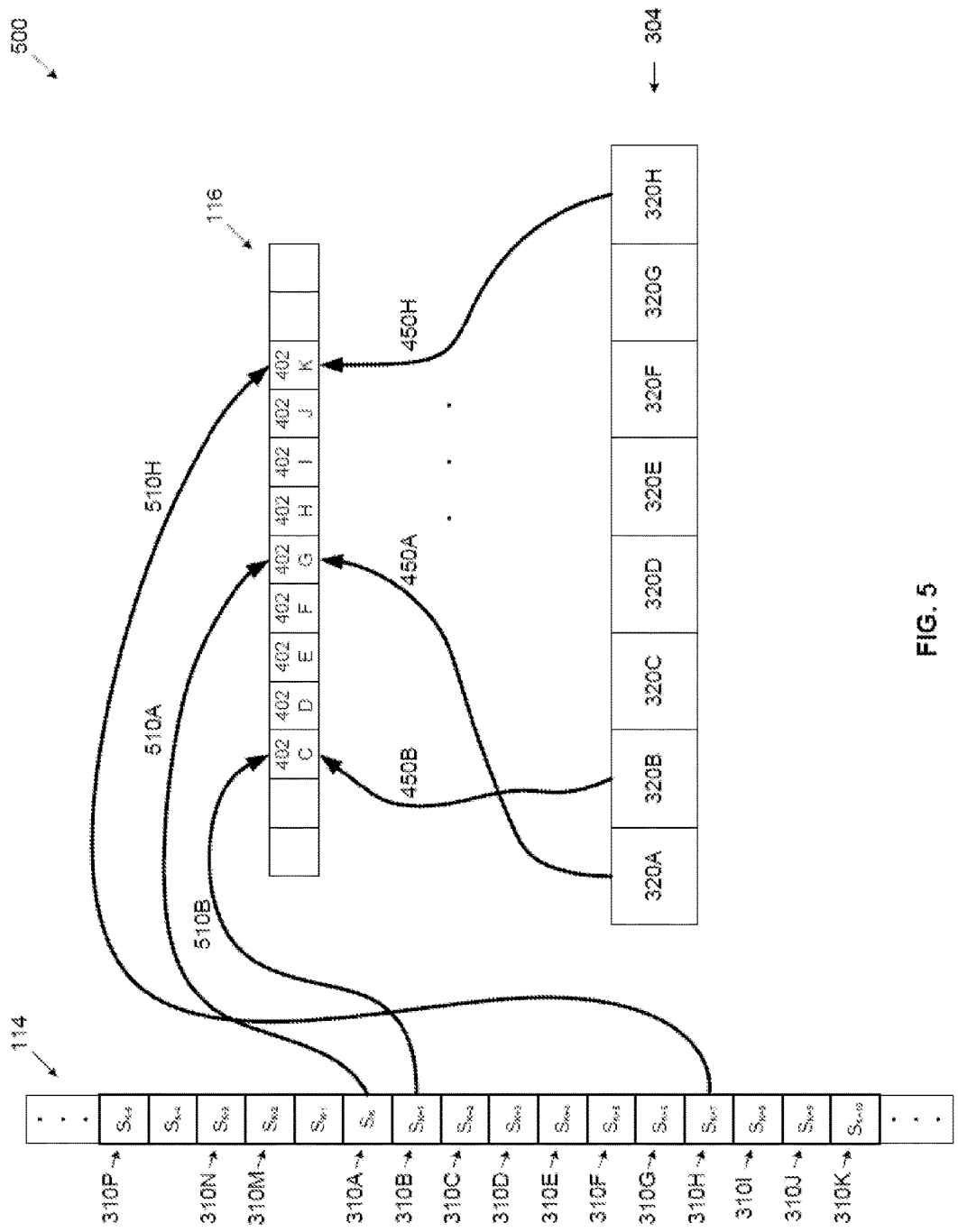
FIG. 5 is a schematic illustration of an exemplary sequence for updating simultaneously a plurality of hash table entries using a SIMD engine, according to some embodiment of the present disclosure.

Reference is now made to FIG. 5, which is a schematic illustration of an exemplary sequence for updating simultaneously a plurality of hash table entries using a SIMD engine, according to some embodiment of the present disclosure. During an exemplary update sequence 500 to a hash table such as the hash table 116, a compressor such as the compressor 112 instructs a SIMD engine such as the SIMD engine 106 to update the hash table 116 with one or more new hash entries such as the hash entries 402 concurrently. The exemplary sequence 500 follows the previous examples of the exemplary load sequence 300, the exemplary concurrent calculation sequence 301 and the exemplary concurrent search sequence 400. The SIMD engine 106 initiates 8 update operations 510 concurrently to update the hash entries 402 with updated hash values and updated pointers to the processed subsets. The SIMD engine 106 updates each of the updated hash entry 402 with a respective one of the calculated hash values 320 and with a pointer to the first data item 310 of the respective subset associated with the calculated hash value 320. As seen in the exemplary update sequence 500, the SIMD engine 106 initiates 8 update operations 510 concurrently to update 8 hash entries 402 in the hash table 116. For example, the update operation 510A is directed at updating the hash entry 402G with the calculated hash value 320A calculated for the processed subset comprising the data items SK 310A through SK+3 310D and with an updated pointer pointing to the data item SK 310A that is the first data item 310 of the processed subset. Following the update operation 510A, the processed subset comprising the data items SK 310A through SK+3 310D is considered an associated subset. Similarly, the update operation 510B is directed at updating the hash entry 402C with the calculated hash value 320B calculated for the processed subset comprising the data items SK+1 310B through SK+4 310E and with an updated pointer pointing to the data item SK+1 310B that is the first data item 310 of the processed subset. Following the update operation 510B, the processed subset comprising the data items SK+1 310B through SK+4 310E is considered an associated subset. The concurrent update operations 510 are similar for all the processed subsets, all the way to the update operation 510H that is directed at updating the hash entry 402K. During the update operation 510H the hash entry 402K is updated with the calculated hash value 320H calculated for the processed subset comprising the data items SK+7 310H through SK+10 310K and with an updated pointer pointing to the data item SK+7 310H that is the first data item 310 of the processed subset. Following the update operation 510H, the processed subset comprising the data items SK+7 310H through SK+10 310K is considered an associated subset.

Reference is made once again to FIG. 2. As shown at 216, the compressor 112 updates the compressed output stream 130 with the processed subsets. For each processed subset indicted as matching (having the same data items 310) an associated subset (previous subset) in the input data stream 120, the compressor 112 replaces the processed subset in the compressed output stream 130 with a pointer to the location of the associated subset. For each processed subset indicted as not matching any associated subset (previous subset) in the input data stream 120, the compressor 112 places the processed subset itself in the compressed output stream 130.

As shown at 218, which is a decision point, the compressor 112 checks if additional data items are available in the input data stream 120. In case additional data items 310 are detected, the process 200 branches to step 206 and the steps 206 through 216 are repeated for additional groups of subsets. In case the compressor 112 determines that the end of the input data stream 120 has been reached, the process 200 branches to 220.

As shown at 220, after the compressor 112 processes the input data stream 120, the compressor 112 outputs the compressed output stream 130 using, for example, the I/O interface 102.

The format of the compressed output data stream 130 may be compliant with a compressed data stream created for the input data stream 120 by legacy (standard) compression methods as known in the art, in particular methods applying sequential compression. The compliance of the compressed output data stream 130 allows decompressing the compressed output data stream 130 using standard decompression, methods, techniques and/or tools as known in the art. Naturally, the decompression format may be selected to the compression format employed by the compressor 112. For example, in case the compressed output data stream 130 conforms to the LZ4 compressed data format, standard LZ4 decompression methods, techniques and/or tools may be required to decompress compressed output data stream 130.

EXAMPLES

Reference is now made to the following examples, which together with the above descriptions illustrate the disclosure in a non-limiting fashion.

Several experiments were conducted to validate the performance improvement provided by the compression process utilizing the SIMD engine such as the SIMD engine 106. During the experiments, a typical input data stream such as the input data stream 120 was compressed using the LZO compression algorithm applied serially to the input data stream as is currently known in the art (legacy methods). The same typical input data stream 120 was also compressed using the a simple compression algorithm as applied by the process 200 utilizing the SIMD engine 106 for concurrently calculating 330 the hash values 320 and searching the hash table 116. Both compression methods (legacy and process 200) were executed on a 3.0 GHz operation frequency Advanced Vector Extensions (AVX) processor by Intel with 16-byte SIMD architecture. The experiments were conducted for various compression ratios as follows: 1.0, 2.3 and 3.8. The results of the experiments are presented in table 1 below.

TABLE 1

|  | Compression Ratio | | |
| --- | --- | --- | --- |
| Compression | 1.0 | 2.3 | 3.8 |
| Performance of LZO standard serial compression (MB/s) | 104 | 243 | 361 |
| Performance of LZO compression using SIMD engine (MB/s) | 171 | 320 | 504 |
| Improvement | 65% | 31% | 39% |

As evident from the table 1, the compression process 200 using the SIMD engine 106 presents a significant performance increase of ~40% compared to the legacy (standard) compression process.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant vector processing technologies such as SIMD will be developed and the scope of the term SIMD is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Throughout this application, various embodiments of this disclosure may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable subcombination or as suitable in any other described embodiment of the disclosure. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

What is claimed is:

1. A system for compressing an input data stream to create a compressed output data stream, the system comprising:
    a memory for storing a hash table, the hash table comprising a plurality of hash entries, each hash entry comprising (a) a hash value of an associated subset of a plurality of subsets of following data items, wherein the following data items are of a plurality of data items of an input data stream, and (b) a pointer to a memory location of the associated subset; and
    a processor coupled to the memory, wherein the processor is configured to:
        execute the following operations, wherein at least one of the following operations is executed by instructing a single instruction multiple data (SIMD) engine to concurrently execute the at least one operation for each processed subset of a group of consecutive subsets of the plurality of subsets, the operations including (i), (ii) and (iii):
            (i) calculating the hash value for each one of the processed subsets,
            (ii) searching the hash table for a match of each calculated hash value, and
            (iii) updating the hash table according to a match result;
        update the compressed output data stream according to the match result and a comparison result of a comparison that depends on the match result; and
        repeat the operations of (i) calculation, (ii) searching and (iii) updating for the plurality of associated subsets to create the compressed output data stream.

2. The system according to claim 1, wherein each of the plurality of associated subsets includes a predefined number of data items defined according to the SIMD engine architecture.

3. The system according to claim 1, wherein the number of processed subsets in the group is set according to the SIMD engine architecture.

4. The system according to claim 1, wherein the match result indicates a match of the each calculated hash value with an existing hash value present in the hash table.

5. The system according to claim 1, wherein the comparison is conducted to produce the comparison result in case the match result indicates a match of the calculated hash value with a matching hash value in the hash table, and
    wherein the comparison comprises comparing between the data items of the processed subset with the calculated hash value and the data items of the associated subset pointed by the pointer in the matching hash entry.

6. The system according to claim 1, wherein,
    in case the comparison result indicates the data items of the processed subset and the associated subset are identical, the processed subset is replaced with a pointer to the associated subset in the compressed output data stream, and in case the comparison result indicates the data items of the processed subset and the associated subset are not identical, the processed subset is updated in the compressed output data stream and the hash table is updated with a new hash entry for the processed subset.

7. The system according to claim 1, wherein a concurrent calculation comprises the processor loading the group of processed subsets to at least one SIMD register of the SIMD engine and the SIMD engine processing concurrently the group of subsets, concurrent processing comprises:

spacing the processed subsets of the group from each other, shifting the processed subsets using a different shift value for each processed subset, and processing the processed subsets to create a hash value for each of the processed subsets.

8. The system according claim 1, wherein a concurrent search for the match of each of the processed subsets in the hash table comprises the processor instructing the SIMD engine to search concurrently for a match of each of the calculated hash values with hash values stored in the hash table.

9. The system according to claim 1, wherein a concurrent update of the hash table with at least one processed subset comprises the processor instructing the SIMD engine to update concurrently the hash table with an entry associated with the at least one processed subset.

10. The system according to claim 1, wherein the compressed output data stream is compliant with a standard compressed output data stream compressed using legacy compression methods, the standard compressed output data stream is decompressed using legacy decompression methods.

11. A method for compressing an input data stream to create a compressed output data stream, the method comprising:

storing a hash table comprising a plurality of hash entries, each hash entry comprising: (a) a hash value of an associated subset of a plurality of subsets of data items, wherein the data items are of a plurality of data items of an input data stream, and (b) a pointer to a memory location of the associated subset;

executing the following operations, wherein at least one of the operations is executed by instructing a single instruction multiple data (SIMD) engine of a processor to execute concurrently the at least one operation for each processed subset of a group of consecutive subsets of the plurality of associated subsets, the operations including (i), (ii) and (iii):

(i) calculating the hash value for each one of the processed subsets, (ii) searching the hash table for a match of each calculated hash value, and (iii) updating the hash table according to a match result;

updating the compressed output data stream according to the match result and a comparison result of a comparison that depends on the match result; and repeating the operations of (i) calculation, (ii) searching and (3) updating throughout the plurality of subsets to create the compressed output data stream.

12. The method according to claim 11, wherein a concurrent calculation comprises the processor loading the group of processed subsets to at least one SIMD register of the SIMD engine, and the SIMD engine concurrently processing the group of processed subsets, concurrent processing comprises:

spacing the processed subsets of the group from each other, and shifting the processed subsets using a different shift value for each processed subset, and processing the processed subsets to create a hash value for each of the processed subsets.

13. The method according to claim 11, wherein a concurrent search for the match of each of the processed subsets in the hash table comprises the processor instructing the SIMD engine to search concurrently for a match of each of the calculated hash values with hash values stored in the hash table.

14. The method according to claim 11, wherein a concurrent update of the hash table with at least one processed subset comprises the processor instructing the SIMD engine to update concurrently the hash table with an entry associated with the at least one processed subsets.

15. The method according to claim 11, wherein the compressed output data stream is compliant with a standard compressed output data stream compressed using legacy compression methods, the standard compressed output data stream is decompressed using legacy decompression methods.

* * * * *